(12) United States Patent
Masuda et al.

(10) Patent No.: US 7,589,596 B2
(45) Date of Patent: Sep. 15, 2009

(54) VOLTAGE CONTROLLED OSCILLATOR AND WIRELESS TRANSCEIVER USING THE SAME

(75) Inventors: Toru Masuda, Kokubunji (JP); Hiroshi Mori, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 172 days.

(21) Appl. No.: 11/435,757

(22) Filed: May 18, 2006

(65) Prior Publication Data

US 2006/0261902 A1 Nov. 23, 2006

(30) Foreign Application Priority Data

May 19, 2005 (JP) ............................. 2005-146323

(51) Int. Cl.
*H03B 5/12* (2006.01)
(52) U.S. Cl. ...................... 331/36 C; 331/167; 331/185
(58) Field of Classification Search ............... 331/36 C, 331/167, 177 V, 185
See application file for complete search history.

(56) References Cited

U.S. PATENT DOCUMENTS

| 6,078,218 | A | 6/2000 | Hirabayashi et al. | ......... 330/254 |
| 7,209,010 | B2 * | 4/2007 | Waible | ...................... 331/36 C |
| 7,236,750 | B2 * | 6/2007 | Vaidyanathan et al. | ......... 455/84 |

FOREIGN PATENT DOCUMENTS

| JP | 8-204451 | 8/1996 |
| JP | 10-247830 | 9/1998 |
| JP | 10-256830 | 9/1998 |

OTHER PUBLICATIONS

T. Nakamura et al., "A Fully Integrated 39.8-/43-GHz VCO—featuring Wide Tuning Range and Low Temperature-drift—for Single-chip MUX/DEMUX LSIs", 2004 IEEE Radio Frequency Integrated Circuits Symposium, TU3A-2, pp. 317-320.

* cited by examiner

*Primary Examiner*—Benny Lee
*Assistant Examiner*—James E Goodley
(74) *Attorney, Agent, or Firm*—Miles & Stockbridge P.C.

(57) ABSTRACT

The capacitance of the capacitor with the constant capacitance is equivalently reduced in the capacitance of a resonant capacitor in a voltage control oscillator to increase the variable amount of the capacitance of the resonant capacitor, and to expand an oscillation frequency range. There are provided a differential negative conductance generator circuit having two resonation nodes for differential output, a differential resonant circuit having a variable capacitance that is controlled by voltage control and an inductance connected in parallel to each other, and a differential negative impedance circuit. A resonant circuit and a negative impedance circuit are connected between the resonation nodes. The capacitor with the constant capacitance that occurs between the resonation nodes is reduced by the negative impedance of the negative impedance circuit. The capacitor with the constant capacitance is represented by floating capacitors that occur between one of the resonation nodes and a ground potential and between the other resonation node and the ground potential, respectively.

9 Claims, 13 Drawing Sheets

VOLTAGE CONTROLLED OSCILLATOR AND WIRELESS TRANSCEIVER USING THE SAME

CLAIM OF PRIORITY

The present patent application claims priority from Japanese application JP No. 2005-146323 filed on May 19, 2005, the content of which is hereby incorporated by reference into this application.

FIELD OF THE INVENTION

The present invention relates to an oscillator suitable for a wireless transceiver, and more particularly to a voltage controlled oscillator that is realized on an integrated circuit and has a variable broad frequency range.

BACKGROUND OF THE INVENTION

As a structural element essential for a wireless communication, there is a local-oscillator signal generator circuit. Ordinarily, a voltage controlled oscillator is used for the local-oscillator signal generator circuit, and the oscillation frequency of the voltage controlled oscillator is controlled to determine the frequency range of the local-oscillator signal. Non-patent document 1: Takahiro Nakamura et al., "A fully Integrated 39.8-/43-GHz VCO-featuring Wide Tuning Range and Low Temperature-drift-for Single-chip MUX/DEMUX LSIs", (U.S.A), Proceedings of 2004 IEEE Radio Frequency Integrated Symposium disclose an example of a voltage controlled oscillator that connects a changeable capacitor element to a resonation node of a differential oscillator with an LC resonator, and discretely changes over the oscillation frequency. Patent Document 1: Japanese Patent Laid-Open No. H8-204451 discloses an example of an oscillator and a filter which connect a negative capacitor that gives a negative capacitance between a resonant circuit including a piezoelectric oscillator and the ground, and is capable of adjusting the capacitance of a capacitor that is connected in parallel to the resonant circuit in a reducing direction thereof. In addition, Patent Document 2: Japanese Patent Laid-Open No. H10-256830 discloses an example of an oscillator circuit that uses a negative impedance circuit and changes an impedance of the negative impedance circuit according to a control voltage to change the oscillation frequency. Patent Document 3: Japanese Patent Laid-Open No. H10-247830 discloses an example of a negative amplifier circuit which applies a negative impedance circuit used in the above oscillator circuit to an amplifier.

SUMMARY OF THE INVENTION

At the present day, the voltage controlled oscillator is mainly applied to a cellular phone wireless transceiver of a communication system such as GSM (Global System for Mobile communications), PDC (Personal Digital Cellular), PHS (Personal Handy-phone System), or PCS (Personal Communication Services), or a wireless transceiver that a wireless LAN (Local Area Network) that conforms to 802.11a, 802.11b, and 802.11g which is the wireless communication specifications defined by the IEEE standard. Also, there are various frequencies that are used in the above communication system and wireless communication specifications. Lower prices, smaller sizes, and lower power consumption for long-time operations are always in demand for those wireless transceivers. As one of the methods of meeting those needs, there is a method in which the wireless communication circuit is realized by a smaller number of semiconductor integrated circuits (hereinafter referred to as "IC"). In particular, attempts have been frequently conducted to realize the wireless communication circuit by a silicon (Si) IC because the substrate material is low in cost, and the high yield is ensured by the high maturity of a semiconductor process. Up to now, there have been proposed a large number of wireless transceivers that are low in price and small in size. In future developments, lower prices and smaller sizes will be demanded, and it is expected to realize a wireless transceiver that is capable of conforming to the above plural wireless communication specifications in order to conduct an optimum wireless communication according to the whereabouts of a user or a user's purpose.

However, in the above conventional wireless communication circuit on the IC, it is impossible to deal with the above various communication frequencies because the frequency range of the voltage controlled oscillator within the IC is narrow. For that reason, a plurality of oscillators is mounted to deal with the various communication frequencies with the result that an increase in the current consumption or an increase in the chip area are not prevented. The oscillator disclosed in Non-patent document 1 eases the above problem to some degree. However, because the minimum value of the capacitor element value is not zero, and a ratio of the maximum value and the minimum value is small, there arises such a problem that the above object cannot be realized by a single voltage controlled oscillator depending on a range of the required oscillation frequency.

This problem is caused by the fact that a capacitor with a constant capacitance (a floating capacitor, etc.) whose capacitance occurring in a resonation node of the voltage controlled oscillator is not changed occupies most of the capacitance required to realize a given oscillation frequency. The quantitative analysis of that cause will be described later.

The negative capacitor disclosed in Patent Document 1 is used in order to reduce a constant capacitance. In an example of the oscillator using the negative capacitor means, as shown in FIG. 3(a) of Patent Document 1, a circuit is added in which a capacitor Cf is inserted between an input and an output of a non-inverting amplifying circuit that is made up of an operational amplifier and resistors Rs, Rf. With this circuit structure, a negative capacitor equivalently occurs between a positive phase input terminal of the operational amplifier and the earth. However, it is assumed that the oscillator shown in the figure uses the operational amplifier. When it is assumed that the gain is A, the circuit operation and effects of the negative capacitance occurrence are obtained in the non-inverting amplifying circuit only under the ideal conditions in which A>>1, and the phase shift from the input to the output of the operational amplifier per se is zero in the frequency by which the negative capacitance occurs. However, the operating band of the operational amplifier at present is about 500 MHz at the maximum. For that reason, it is difficult to apply the circuit technology disclosed in Patent Document 1 to a voltage controlled oscillator that oscillates at the GHz band.

The problem to be solved by the present invention will be described in more detail with reference to the accompanying drawings. FIG. 10 shows a general differential voltage controlled oscillator with an LC resonator that is made up of a differential LC resonant circuit (DRC) 10 and a differential negative conductance generator circuit (NGC) 11. It is assumed that the C component of the resonant circuit, that is, the capacitance of a resonant capacitor changes according to a voltage that is applied to a capacitance control terminal 100. Also, it is assumed that the L component of the resonant circuit, that is, the resonance inductance, is realized by an external element of the IC through a pad on the IC, or realized by an element on the IC.

A positive phase terminal (+) and a negative phase terminal (−) that are differential terminals of the LC resonant circuit 10 are connected to a positive phase terminal (+) and a negative phase terminal (−) of the negative conductance generator circuit 11, to thereby form a positive phase resonation node OUT and a negative phase resonation node OUTB. The negative conductance generator circuit 11 is used for the purposes of generating a negative conductance to supplement the loss of electric powers that are generated in the resonation nodes OUT and OUTB, and to maintain the oscillation as an oscillator. A different signal is outputted from the resonation nodes OUT and OUTB.

A capacitor bank (VCC) 12 is connected to the resonation nodes OUT and OUTB for the purpose of discretely remarkably changing the capacitance of a resonant capacitor. Because the capacitor bank 12 is connected to the differential nodes OUT and OUTB, a differential capacitor bank is formed by the same two capacitor banks (VCC) 12. The terminals of the two capacitor banks (VCC) 12 which are indicated by identical reference are connected to each other. A DC voltage of a constant value is applied to a terminal with a reference voltage 120, and a switching DC voltage is applied to an arbitrary terminal of plural terminals for switching voltage for variable capacitors for the capacitor bank 121 to 12n. The capacitances that appear in the respective resonation nodes OUT and OUTB stepwise change due to potential differences between the terminals 121 to 12n to which the DC voltage is applied and the terminal 120.

An example of a specific circuit of the voltage controlled oscillator of the above type will be described with reference to FIG. 11. Referring to FIG. 11, a differential LC resonant circuit 10 is made up of inductors L1, L2, variable capacitor diodes D1, D2, and a bias resistor R1. The inductances of the inductors L1 and L2 are equal to each other, and the capacitances of the variable capacitor diodes D1 and D2 are equal to each other. A differential negative conductance generator circuit 11 is made up of transistors Q1 and Q2 which are emitter-connected with each other, a constant current source Ics1, bypass capacitors CBP1, CBP2, and bias resistors R2 and R3.

The capacitor bank 12 is made up of n (n: positive integer) capacitors including Cs1 to Csn which take binary capacitances according to a potential difference between the terminal 120 and the terminal 121. It is assumed that parasitic capacitors between the wirings and the earth at the resonation nodes OUT and OUTB are Cp1 and Cp2, respectively, and those parasitic capacitances are equal to each other. Given constant voltages are applied to the respective parasitic capacitors Cp1 and Cp2 as supply voltages V1, V2, and V3, respectively.

The oscillation frequency is determined according to an inductance L and a capacitance C viewed from a point between one of the resonation nodes OUT and OUTB and the earth (a neutral point of the differential operation), and represented by the following expression (1).

$$Fosc=1/(2\pi\sqrt{(L \cdot C)}) \quad (1)$$

In this situation, when it is assumed that L=L1 (=L2) and C=Cv+Cs+Cp, the following expression is satisfied.

$$Fosc=1/(2\pi\sqrt{(L1 \cdot (Cv+Cs+Cp))}) \quad (2)$$

where Cv is the capacitance of the variable capacitor diode D1 (=the capacitance of the variable capacitor diode D2), Cs is the capacitance of the capacitor bank 12, and Cp is the capacitance of the parasitic capacitor Cp1 at the resonation node OUT (=the capacitance of the parasitic capacitor Cp2).

This example will be described assuming that an upper limit of a desired frequency band is 4400 MHz, a lower limit thereof is 3200 MHz. When it is assumed that the inductance of the inductor L1 (=L2) is 0.5 nH, it is necessary that the capacitance of any one of the resonation nodes OUT and OUTB is 2.62 pF in the case of 4400 MHz, and 4.95 pF in the case of 3200 MHz. Those capacitances are realized by Cv+Cs+Cp from the expression (2). The capacitances Cv and Cs have upper and lower limits (Cmax and Cmin), respectively. The capacitance Cv is continuously changed according to a control voltage Vcnt that is applied to the capacitance control terminal 100 as shown in FIG. 12A. It is assumed that the Cmin/Cmax is a ratio α (0.85 in this example). Also, it is assumed that a capacitance difference between Cmin and Cmax is ΔCv. Likewise, the capacitance value Cs is the maximum and minimum capacitances that are realized by the potential difference between the terminal 121 and the terminal 120 by the capacitor bank 12 as shown in FIG. 12B, and it is assumed that its ratio β (Cmin/Cmax) is 0.3. Also, when it is assumed that the capacitance difference between Cmin and Cmax is ΔCs, in the case where the capacitance of the resonant capacitor 2.62 pF is realized by the combination of the minimum values of Cv=1.55 pF and Cs=0.77 pF with the parasitic capacitor Cp (=0.3 pF), the oscillation frequency of 4400 MHz is obtained.

In the same structure, it is calculated whether the target oscillation frequency of 3200 MHz is obtained by maximizing the capacitances Cv and Cs, respectively, or not. The maximum value of Cv is 1.82 pF, and the maximum value of Cs is 2.58 pF from the above ratio of α and β. Even in the combination of the above capacitance with parasitic capacitance 0.3 pF, the capacitance of the resonant capacitor becomes 4.7 pF, and the oscillation frequency becomes 3285 MHz, which is incapable of satisfying the target frequency of 3200 MHz. The oscillation frequency range can be enlarged by changing the capacitance ratio of α and β, or the ratio of Cv and Cs. However, since the above numeric example is a representative value in Si.RFIC, it is apparent that it is difficult to realize the voltage controlled oscillator having a frequency range of from 4400 MHz to 3200 MHz.

FIG. 3 shows the breakdown of a target capacitance of the resonant capacitor and the exemplified capacitances Cv and Cs at a column of "without negative capacitance generated by negative impedance circuit". In order to obtain the target capacitance of the resonant capacitor, it is necessary that a fixed value of the capacitance of the resonant capacitor is reduced, to thereby increase the capacitances Cv and Cs, a variable amount (ΔCv, ΔCs) is relatively increased.

The oscillator circuit disclosed in Patent Document 2 is structured by using no LC resonant circuit, and therefore does not use an inductor. Instead, both of the emitters in the negative conductance generator circuit is not connected by a wire, but is connected by a series circuit consisting of a resistor and a capacitor to generate a negative capacitance. The negative capacitance is used as the above inductor. Therefore, there is no disclosure in Patent Document 2 that the LC resonant circuit is used, and a variable range of the capacitance is widened. Also, Patent Document 2 uses the negative capacitance, but is directed to an amplifier which is different in the structure from the oscillator.

The present invention has been made in order to overcome the above problems, and therefore an object of the present invention is to increase a variable amount of the capacitance of a resonant capacitor by equivalently decreasing the capacitance of a capacitor with a constant capacitance in a capacitance of the resonant capacitor of a voltage controlled oscillator.

In order to achieve the above object, a typical example of the present invention will be described below. That is, according to the present invention, there is provided a voltage controlled oscillator comprises a differential negative conductance generator circuit having first and second terminals for differential output, a differential resonant circuit having a variable capacitance which is controlled by voltage control and an inductance connected in parallel to each other, wherein the differential resonant circuit is connected between the first terminal and the second terminal, and a differential negative impedance circuit connected between the first terminal and the second terminal, wherein a capacitance of a capacitor with a constant capacitance that occurs between the first terminal and the second terminal is reduced by a negative impedance of the negative impedance circuit. In this way, because the capacitance of the capacitor with the constant capacitance is reduced, it is possible to increase a variable amount of the capacitance of the resonant capacitor in the resonant circuit. This makes it possible to expand a variable range of the oscillation frequency of the voltage controlled oscillator. The capacitor with the constant capacitance is represented by floating capacitors that occur between the first terminal and a voltage with ground potential and between the second terminal and the voltage with ground potential, respectively.

It is desirable to connect, between the first terminal and the second terminal, a differential capacitor bank having at least one pair of capacitors which is connected in parallel, each pair of the at least one pair of capacitors having two capacitors connected in series and a capacitance of each capacitor of the at least one pair of capacitors changing to two values according to high and low of a magnitude of a supply voltage. Alternatively, it is desirable to connect, between the first terminal and the ground potential and between the second terminal and the ground potential, capacitor banks having at least one capacitor that is connected in parallel, each capacitor of the at least one capacitor changing to two values according to high and low of the magnitude of a supply voltage, respectively. This makes it possible to expand further a variable range of the oscillation frequency of the voltage controlled oscillator.

Also, it is desirable that the negative conductance generator circuit includes a first transistor whose output terminal is connected to the first terminal, and a second transistor whose output terminal is connected to the second terminal, wherein an input terminal of the first transistor is connected to the second terminal through a first capacitor, an input terminal of the second transistor is connected to the first terminal through a second capacitor, and ground terminals of the first transistor and the second transistor are connected to each other, and a first current source is connected to a connection node of the ground terminals. Further, it is desirable that the negative impedance circuit includes a third transistor whose output terminal is connected to the first terminal and a fourth transistor whose output terminal is connected to the second terminal, and a third capacitor which is connected between a ground terminal of the third transistor and a ground terminal of the fourth transistor, wherein an input terminal of the third transistor is connected to an input terminal of the second transistor, an input terminal of the fourth transistor is connected to an input terminal of the first transistor, a second current source is connected to the ground terminal of the third transistor, and a third current source is connected to the ground terminal of the fourth transistor.

According to the present invention, because the negative impedance circuit is disposed in the voltage controlled oscillator to reduce the capacitance of the capacitor with the constant capacitance, the variable amount of the capacitance of the resonant capacitor in the resonant circuit can be increased, thereby making it possible to expand the variable range of the oscillation frequency of the voltage controlled oscillator.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

Now, a description will be given in more detail of various embodiments of a voltage controlled oscillator according to the present invention and a wireless transceiver using the oscillator with reference to the accompanying drawings.

Figure 1:
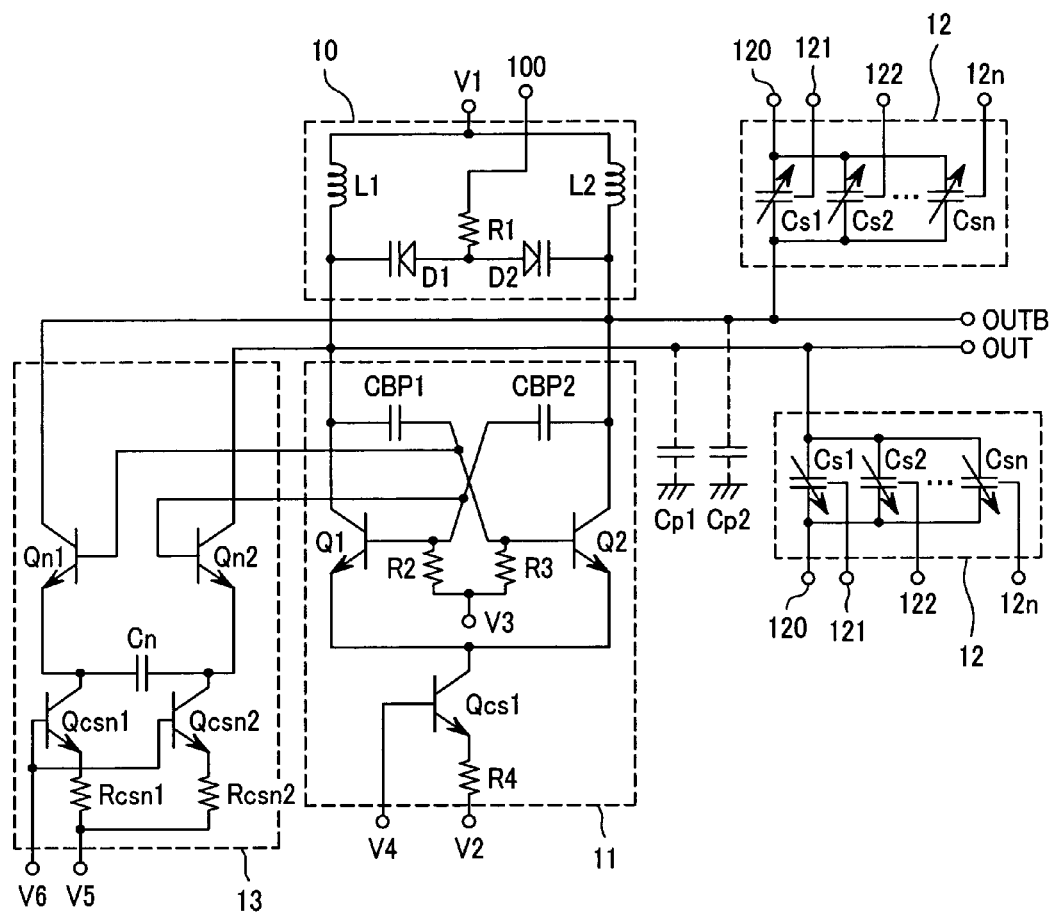
FIG. 1 is a circuit diagram for explaining a first embodiment of the present invention.

FIG. 1 shows a first embodiment according to the present invention. A voltage controlled oscillator includes a differential LC resonant circuit 10, a differential negative conductance generator circuit 11, two capacitor banks 12, parasitic capacitors Cp1 and Cp2, and a differential negative impedance circuit 13. The respective positive phase terminals+ and the respective negative phase terminals−of the differential LC resonant circuit 10, the differential negative conductance generator circuit 11, and the differential negative impedance circuit 13 are connected to each other, respectively, to thereby form a positive phase resonation node OUT (first terminal) and a negative phase resonation node OUTB (second terminal). Those two capacitor banks 12 are connected to the resonation nodes OUT and OUTB, respectively, and those capacitor banks 12 are integrated into a differential capacitor bank. The parasitic capacitors Cp1 and Cp2 are disposed on the wires of the resonation nodes OUT and OUTB, respectively. A differential signal is outputted from the resonation nodes OUT and OUTB.

The differential LC resonant circuit 10 is made up of inductors L1, L2, variable capacitor diodes D1, D2, and a bias resistor R1. A frequency control voltage Ccnt is applied to a capacitor control terminal 100. In the differential LC resonant circuit 10, inductors consisting of inductors L1 and L2 that are connected in series and variable capacitances consisting of variable capacitor diodes D1 and D2 that are connected in series are connected in parallel to each other.

The differential negative conductance generator circuit 11 includes transistors Q1 (first transistor) and Q2 (second transistor) which are emitter-coupled with each other, a transistor Qcs1 (fifth transistor) having an emitter coupled with V2 to form a constant current source (first current source), a resistor R4, a bypass capacitor CBP1 (first capacitor), a CBP2 (second capacitor), and bias resistors R2 and R3. Given constant voltages are applied as supply voltages V1, V2 (second voltage source) that is connected to the resistor R4, and V3, respectively. Also, a given constant voltage is applied as a bias voltage V4 (first voltage source) that is applied to the transistor Qcs1. In the present specification, in the case where A and B are connected with the interposition of any element or wire, it is defined that A and B are coupled.

Each of the capacitor banks 12 is made up of n (n: positive integer) capacitors including Cs1 to Csn that take binary capacitances according to the voltage differences between the terminal 120 and the respective terminals 121 to 12n, respectively. The terminals denoted by the same references in those two capacitor banks (VCC) 12 are connected to each other. A constant DC voltage is applied to the terminal with the reference voltage 120, and a switching DC voltage is applied to an arbitrary terminal of the plurality of terminals with switching voltages for variable capacitors for the capacitor bank 121 to 12n. The capacitances that occur in the respective resonation nodes OUT and OUTB gradually change according to the voltage differences between the terminals 121 to 12n to which the DC voltage is applied and the terminal 120. From the viewpoint of the differential capacitor bank that is connected between the resonation nodes OUT and OUTB, each of Cs1, Cs2, . . . , Csn in the two capacitor banks 12 is represented by one pair of capacitors that are connected in series. Each of the one pair of capacitors is represented by being connected in parallel to each other between the resonation nodes OUT and OUTB.

The negative impedance circuit 13 is made up of a transistor Qn1 (third transistor), a transistor Qn2 (fourth transistor), a transistor Qcsn1 (sixth transistor) whose emitter is coupled with V5 (fourth voltage source) to form a constant current source (second current source) at the transistor Qn1 side, a resistor Rcsn1, a transistor Qcsn2 (seventh transistor) whose emitter is coupled with V5 to form a constant current source (third current source) at the transistor Qn2 side, a resistor Rcsn2, and an inter-emitter coupling capacitor Cn (third capacitor). Given constant voltages are applied as the supply voltage V5 that is connected to the resistors Rcsn1 and Rcsn2, and the bias voltage V6 (third voltage source) that is applied to the transistors Qcsn1 and Qcsn2, respectively.

In the above structure, since bipolar transistors are employed for the respective transistors, the voltage controlled oscillator according to this embodiment is of the bipolar type, and operates with the supply voltage of about 3 V.

Figure 2:
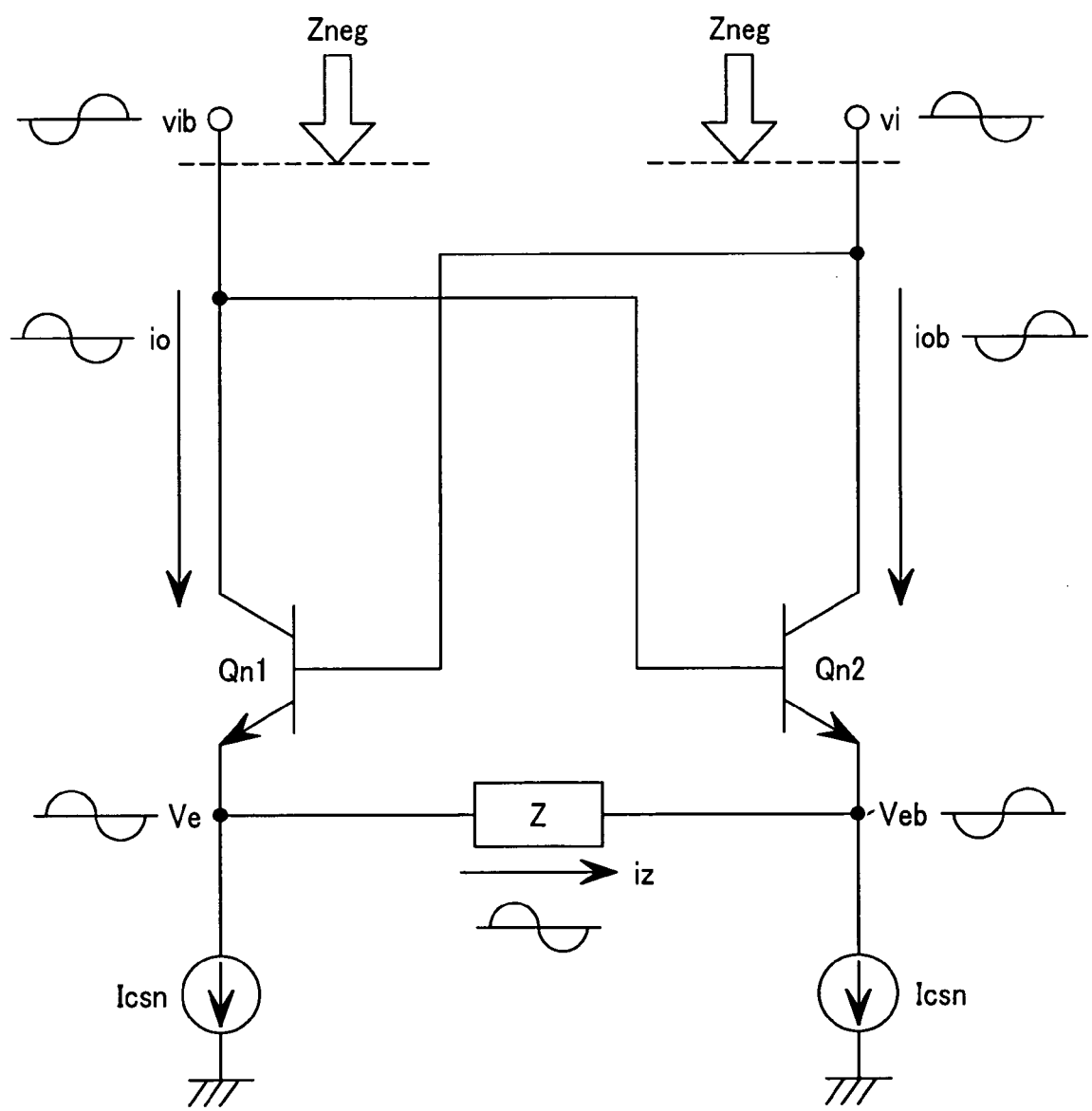
FIG. 2 is a circuit diagram for explaining a basic structure of a differential negative impedance circuit according to the present invention.

Hereinafter, the operation of the negative impedance circuit 13 will be described with reference to a basic circuit shown in FIG. 2. The basic circuit shown in FIG. 2 is made up of transistors Qn1 and Qn2 whose emitters are coupled with each other by an impedance Z, and a constant current source Icsn that biases the respective transistors. Waveforms in the figure are shown in order to express the phases of the voltage and current signals.

It is assumed that when an AC voltage of the base of the transistor Qn1 is vi, its negative phase AC voltage vib (its amplitude is equal to that of vi) is applied to the base of the transistor Qn2. In this example, since the transistors Qn1 and Qn2 operate as an emitter follower by the constant current source Icsn, the AC voltages ve and veb of the emitter can be approximately regarded as the AC voltages vi and vib, respectively. For that reason, a current iz that flows in the impedance Z between the respective emitters is represented by the following expression (3).

$$iz=(ve-veb)/Z=(vi-vib)/Z=2vi/Z \qquad (3)$$

Also, when it is assumed that the AC currents that flow in the transistors Qn1 and Qn2 are io and iob, respectively, the following expression is satisfied.

$$iz=io=-iob \qquad (4)$$

where |vi|=|vib|

In order to generate the negative impedance, it is necessary to conduct connection so that the AC voltage vi and the AC current iob shown in FIG. 2 are generated at the same node. In this situation, the conditions of io−iz=0, iob+iz=0, vi=−vib=ve=−veb, iz=(ve−veb)/Z are satisfied, whereby the negative impedance Zneg of the following expression (5) can be generated between the position phase terminal + and the earth (similarly between the negative phase terminal − and the earth).

$$Zneg=vi/iob=vi/(-iz)=-Z/2 \qquad (5)$$

In other words, 2 Zneg can be generated between the positive phase terminal + and the negative phase terminal −. In order to generate the negative capacitor, it is necessary to generate the capacitor C in the impedance Z. In this case, the expression (5) is represented by the following expression, and a negative capacitor of −2C is obtained between the positive phase terminal + and the earth (likewise, between the negative phase terminal − and the earth).

$$Zneg=-(1/(j\omega C\cdot 2))=1/(j\omega\cdot(-2C)) \qquad (6)$$

The capacitances of the capacitors with the constant capacitances which occur in the respective resonation nodes OUT and OUTB are equivalently reduced. In other words, the negative capacitor of −C is obtained between the positive phase terminal + and the negative phase terminal −, to thereby equivalently reduce the capacitances of the capacitors with the constant capacitances between the resonation node OUT and the resonation node OUTB.

In the case where the negative impedance circuit shown in FIG. 2 is used at the frequency band of GHz or more, the capacitance of the capacitor C is relatively decreased because the respective frequencies ω per se become large. For that reason, an influence of the parasitic resistor that constitutes the circuit becomes large, and the effective negative impedance changes. The parasitic resistor component to be taken into consideration is a resistor Rgm that is generated by the mutual conductance of the transistors Q1 and Q2. The resistor Rgm is generated in series with the negative impedance, and its resistance is −1/gm which is a negative value. Also, the parasitic emitter resistor RE of the transistors Q1 and Q2 is generated as a negative resistor, and the negative impedance Zneg' that takes an influence of the parasitic element into consideration is expressed as follows:

$$Zneg'=-1/gm-RE+1/(j\omega \cdot (-2C)) \quad (7)$$

The negative impedance circuit 13 according to the first embodiment shown in FIG. 1 is obtained by modifying the negative impedance circuit described with reference to FIG. 2 and applying the modified circuit to the voltage controlled oscillator. The capacitor C is given as the inter-emitter coupling capacitor Cn. The collector (negative phase terminal −) of the transistor Qn1 is coupled with the resonation node OUTB, and the collector (in-phase terminal +) of the transistor Qn2 is coupled with the resonation node OUT. In the negative impedance circuit 13 shown in FIG. 1, the bases of the transistors Qn1 and Qn2 are connected not to the resonation nodes OUT and OUTB, but to the bases of the transistors Q2 and Q1 within the negative conductance generator circuit 11, respectively.

The above connection has two advantages. One advantage is that the voltage change of the resonation nodes OUT and OUTB can be detected without connecting the input parasitic capacitors of the transistors Qn1 and Qn2 to the resonation nodes OUT and OUTB. As a result, the negative impedance circuit 13 is added, thereby making it possible to suppress the parasitic capacitors of the resonation nodes OUT and OUTB from increasing. Another advantage is that the biases between the bases and the collectors of the transistors Qn1 and Qn2 can be made negative. A bias voltage is set to the bases of the transistors Qn1 and Qn2 so that the biases of the bases and the collectors become negative when the respective transistors are conductive. As a result, the operating speeds of the transistors Qn1 and Qn2 are increased.

On the other hand, as in the circuit structure shown in FIG. 2, when the base of one of the transistors Qn1 and Qn2 is connected to the collector of another transistor, the base and the collector of each of transistors are identical in the potential with each other with respect to the DC bias voltage. For that reason, the high speed operation as high as that of the transistors Q1 and Q2 in the negative conductance generator circuit 11 shown in FIG. 1 cannot be expected. In order to overcome above drawback, in the negative impedance circuit 13 shown in FIG. 1, the bases of the transistors Qn1 and Qn2 are connected to the terminals having the same bias potentials as those of the transistors Q2 and Q1 in the negative conductance circuit, respectively. The voltage amplitudes that appear in the bases of the transistors Qn1 and Qn2 are different from the voltages of the resonation nodes OUT and OUTB. However, the capacitance Cn of the negative impedance circuit 13 is adjusted, thereby making it possible to generate a desired negative capacitor in the resonation nodes OUT and OUTB.

Figure 3:
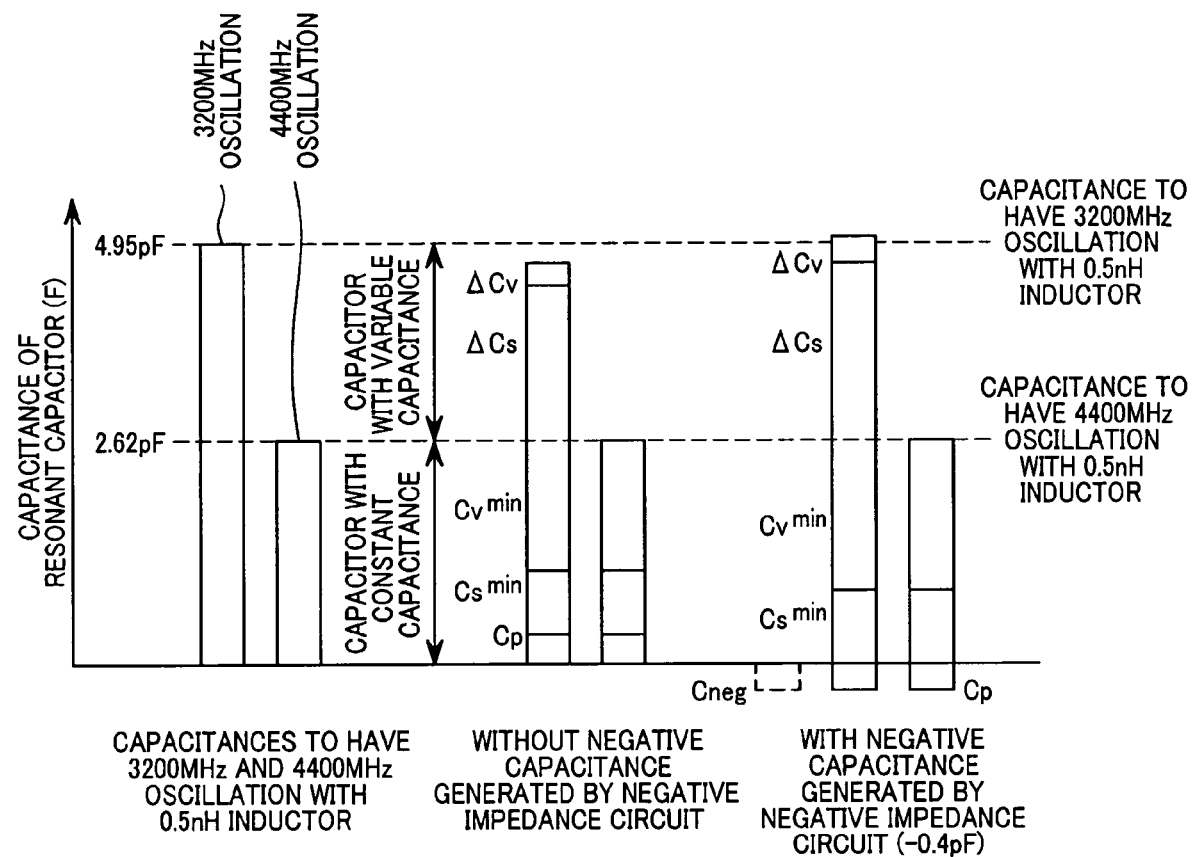
FIG. 3 is a circuit diagram for explaining the breakdown of a capacitance of the resonant capacitor in a differential oscillator with an LC resonator.

The advantages of this embodiment will be quantitatively described with reference to FIG. 3. When it is assumed that the capacitance of the inter-emitter coupling capacitor Cn is 0.2 pF, it is possible to generate the negative capacitance of −0.4 pF in the resonation nodes OUT and OUTB by using the expression (7). As a result, because the capacitors with the constant capacitances at the resonation nodes OUT and OUTB can be increased, Cv that is the capacitance of the diodes D1 and D2 and Cs that is the capacitance of the capacitor bank 12 can be increased. It is assumed that the parasitic capacitor Cp1=(Cp2) of the resonation node OUT is 0.4 pF because of the parasitic capacitor of the negative impedance circuit per se. In order to obtain the capacitance of the resonant capacitor of 2.62 pF, the minimum values of the capacitors Cv and Cs are set to 1.75 pF and 0.87 pF taking the values of negative capacitor and the parasitic capacitor Cp into consideration, respectively. Since the maximum values of the capacitors Cs and Cv are 1/0.85 times and 1/0.3 times of the minimum values, respectively, those maximum values are 2.055 pF and 2.911 pF. The maximum value of the capacitance of the resonant capacitor becomes 4.961 pF by combining the negative capacitance −0.4 pF with the parasitic capacitance 0.4 pF, and the oscillation frequency of 3200 MHz is obtained in the case of 0.5 pH. In other words, the oscillation frequency range can be enlarged by a voltage control oscillator having the negative impedance circuit 13. As an example, the oscillation frequencies of 3200 MHz and 4400 MHz can be realized by one voltage controlled oscillator. With respect to the above description, it is shown at a column of "with negative capacitance generated by negative impedance circuit (−0.4 pF)" that an example of a target capacitance of the resonant capacitor is obtained by using the negative capacitor Cneg=−0.4 pF in order to reduce the fixed value in the capacitance of the resonant capacitor.

In the above description, the voltages of the bases of the constant current source transistors Qcsn1 and Qcsn2 in the negative impedance circuit 13 are set to the given constant voltages. When the setting of the base voltages is changed, and the voltage V5 of the bases is set to be equal to be the supply voltage V4 of the negative impedance circuit 13, it is possible to cut off the transistors Qcsn1 and Qcsn2 as well as the transistors Qn1 and Qn2, respectively, so as to nullify the operation of the negative impedance circuit. Because this function makes it possible to temporarily increase the capacitance of the resonant capacitors, the oscillation frequency is further reduced, and the variable frequency range can be increased.

Figure 4:
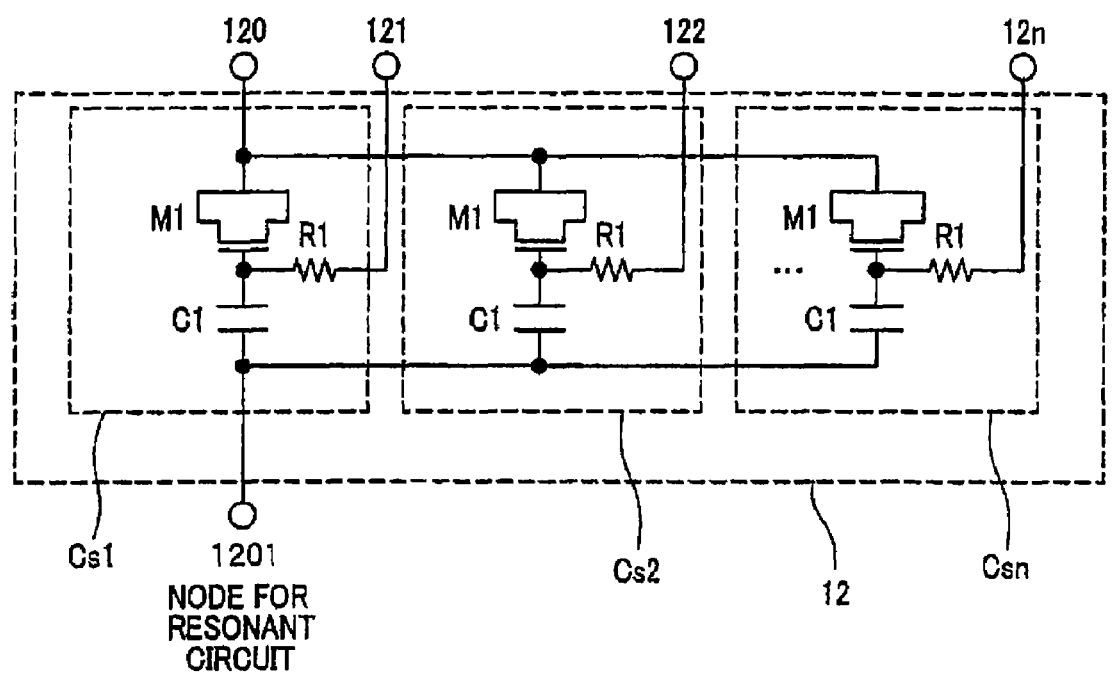
FIG. 4 is a circuit diagram for explaining an example of a capacitor bank according to the present invention.

Subsequently, FIG. 4 shows an example of a specific circuit of the capacitor bank 12. Each of then capacitors Cs1 to Csn is structured as a unit capacitor cell. The unit capacitor cell is made up of a capacitor C1, a MOS transistor M1 having a drain and a source coupled with each other, and a gate bias resistor R1. All of the drains and the sources of the MOS in the respective unit capacitor cells are made common to each other, and a constant voltage V120 is applied to a terminal 120. One terminal of the resistor R1 in each of the unit capacitor cells is set as a terminal 121 (122, . . . , 12*n*), and binary voltage values V121 (V122, . . . , V12*n*) are set opposite the constant voltage of the terminal 120. In the case where the potential relationship satisfies V121>V120, the MOS capacitance takes a value of Cmin, and in the case where the potential relationship satisfies V121<V120, the MOS capacitance takes a value of Cmax.

The value of the capacitor C1 is set to a value that is larger than Cmax by about 10 times, and the capacitance viewed from the terminal with the capacitor 1201 is determined according to the MOS capacitor. The unit capacitor cell is capable of arbitrarily changing the MOS capacitance by changing the gate area of the MOS. Accordingly, the unit capacitance cell shown in FIG. 4 shows in principle the circuit structure, and the MOS capacitance can be set, individually.

Figure 5:
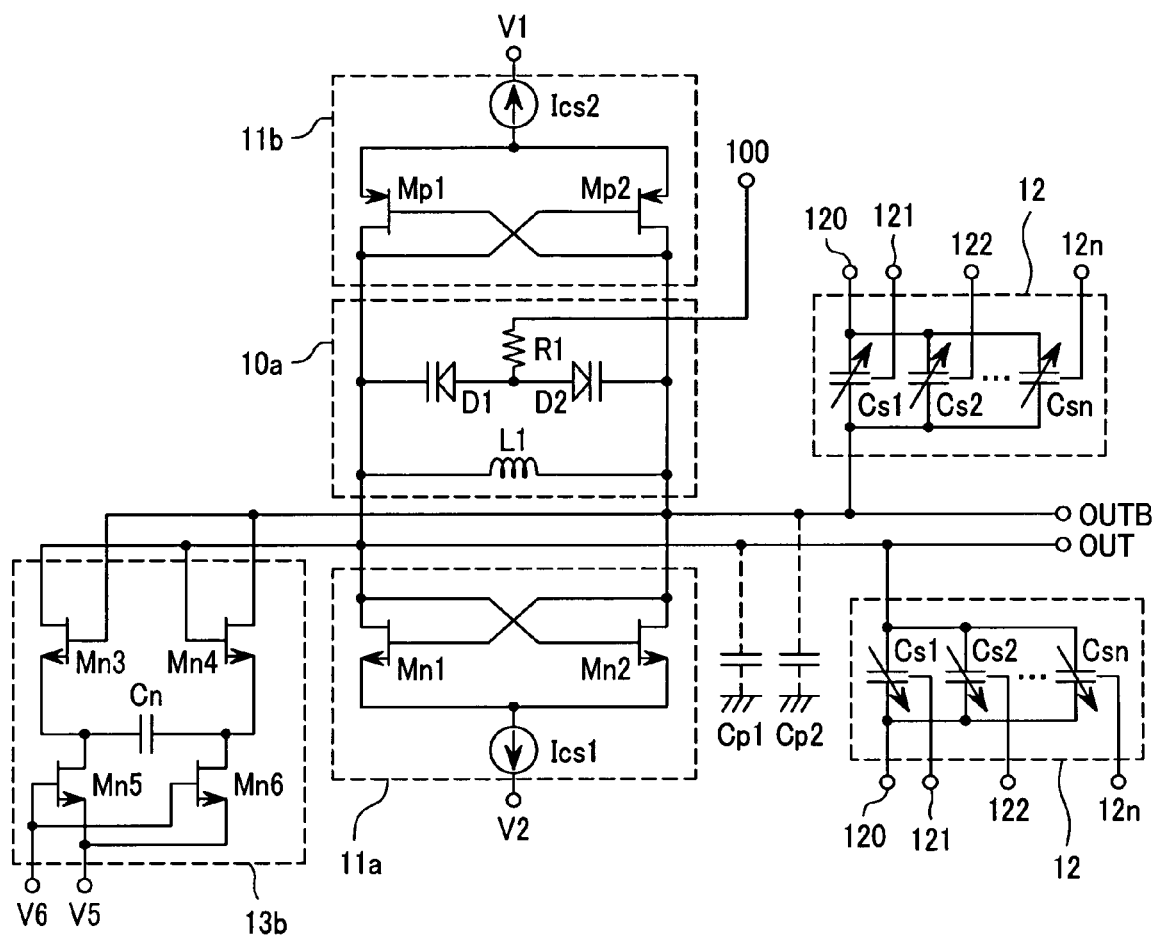
FIG. 5 is a circuit diagram for explaining a second embodiment of the present invention.

FIG. 5 shows a second embodiment of the present invention. The first embodiment shown in FIG. 1 is structured as the bipolar voltage controlled oscillator whereas this embodiment is structured as an MOS voltage controlled oscillator using the MOS transistor. This embodiment will be described below. The same structures as those of the first embodiment will be omitted from description. In the present specification, in the bipolar transistor and the MOS transistor, the bases and the gates are described as the input terminals, the collectors and the drains are described as the output terminals, and the emitters and the sources are described as the ground terminals.

Referring to FIG. 5, the negative conductance generator circuit includes two circuits of a negative conductance generator circuit 11*a* (first negative conductance generator circuit) and a negative conductance circuit 11b (second negative conductance generator circuit) which are used complementarily. The negative conductance generator circuit 11a is made up of source-coupled nMOS transistors Mn1 (first nMOS transistor), Mn2 (second nMOS transistor), and a constant current source Ics1 (first current source). Also, the negative conductance generator circuit 11b is made up of source-coupled p MOS transistors Mp1 (first p MOS transistor), Mp2 (second p MOS transistor), and a constant current source Ics2 (second current source). The negative impedance circuit 13a is made up of an nMOS transistor Mn3 (third nMOS transistor), an Mn4 (fourth nMOS transistor), a source coupling capacitor Cn, an nMOS transistor an nMOS transistor Mn5 (fifth nMOS transistor) that is a constant current source (third current source) at the transistor Mn3 side, and an nMOS transistor Mn6 (sixth nMOS transistor) that is a constant current source (fourth current source) at the transistor Mn4 side. The bias voltage V6 (first voltage source) is applied to the gates of the transistors Mn5 and Mn6, and the supply voltage V5 (second voltage source) is applied to the sources of the transistors Mn5 and Mn6.

The gates of the transistors Mn1 to Mn4, Mp1, and Mp2 are connected to the drains of the others of the paired transistors, respectively. A voltage between the drain and the gate of the MOS transistor is set with the flexibility, and even if the gates of the transistors Mn1 to Mn4, Mp1, and Mp2 are connected to the drains of the others of the paired transistors, respectively, the same operational principle effects as those in the first embodiment can be obtained. Also, appropriate bias voltages are applied to the transistors Mn5 and Mn6.

The drain (positive phase terminal +) of the nMOS transistor Mn3 is coupled with the resonation node OUT, and the drain (negative phase terminal −) of the nMOS transistor Mn4 is coupled with the resonation node OUTB. The nMOS transistors Mn1 and p MOS transistor Mp1 are connected to each other between the respective drains and between the respective gates to form a CMOS (complementary CMOS) transistor. Likewise, the nMOS transistors Mn2 and p MOS transistor Mp2 are connected to each other between the respective drains and between the respective gates to form a CMOS transistor. An LC resonant circuit 10a is made up of an inductor L and variable capacitor diodes D1 and D2 that are connected in series with each other. Given voltages are applied as the supply voltages V1, V2, V5, and the bias voltage V6, respectively.

In this embodiment, those two negative conductance circuit 11a and negative conductance circuit 11b are complementarily used as the negative conductance circuit, thereby making it possible to compensate the lower gm of the MOS transistor with respect to the bipolar transistor. In addition, the structure of FIG. 5 is applied to set a threshold value Vth of the MOS transistor to |Vth|=0.2 V, thereby making it possible to operate at a lower supply voltage of about 1.5 V. The bipolar voltage controlled oscillator shown in FIG. 1 operates at about 3 V whereas the supply voltage is reduced by about 50%.

Figure 6:
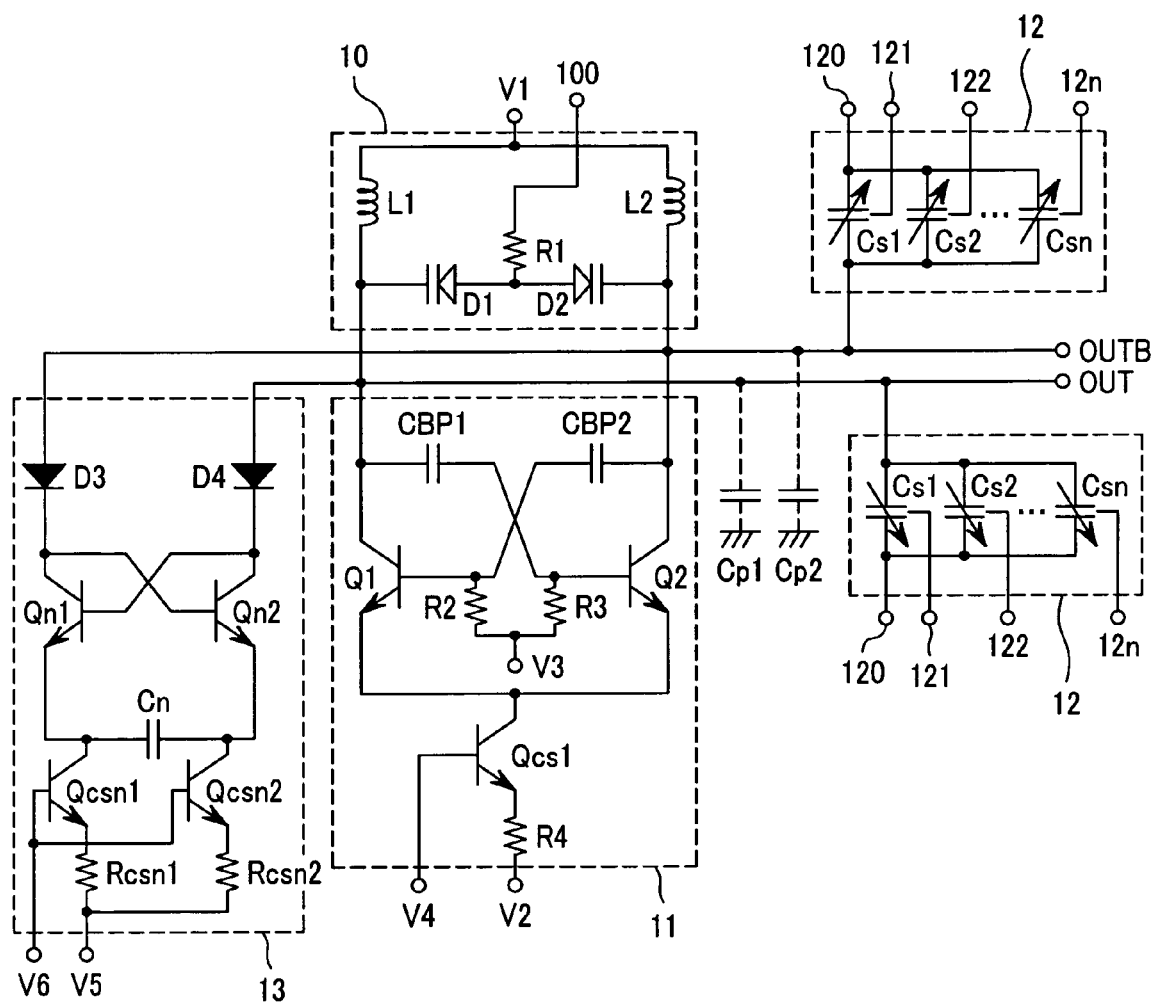
FIG. 6 is a circuit diagram for explaining a third embodiment of the present invention.

FIG. 6 shows a third embodiment according to the present invention. The structure of the negative impedance circuit is different from the circuit structure of the first embodiment. In a negative impedance circuit 13b shown in FIG. 6, the bases and the collectors of the transistors Qn1 and Qn2 are cross-connected to each other. Diodes D3 (first diode) and D4 (second diode) are disposed between the respective collectors of the transistors Qn1 and Qn2 and the respective resonation nodes. With the above structure, the collector of the transistor Qn1 is coupled with the resonation node OUTB through the diode D3, and the collector of the transistor Qn2 is coupled with the resonation node OUT through the diode D4.

The impedance values of the collectors of the transistors Qn1 and Qn2 are represented by the expression (7). An impedance that is developed at both ends of each of the diodes D3 and D4 is 1/gmD+RD. In this example, gmD is a mutual conductance of the diodes D3 and D4, and RD is a parasitic series resistance. An impedance Zneg" that are developed at each of the resonation nodes OUT and OUTB by the negative impedance circuit 13b can be represented by the following expression (8).

$$Zneg''=-1/gm-RE+1/(j\omega(-2C))+1/gmD+RD \qquad (8)$$

The joint area of the diodes D3 and D4 and the emitter areas of the transistor Qn1 and Qn2 are so adjusted as to reduce the resistant component (−1/gm−RE+1/gmD+RD) in the impedance Zneg". With this structure, the sharpness Q of the resonation viewed from the resonation nodes OUT and OUTB can be increased.

Figure 7:
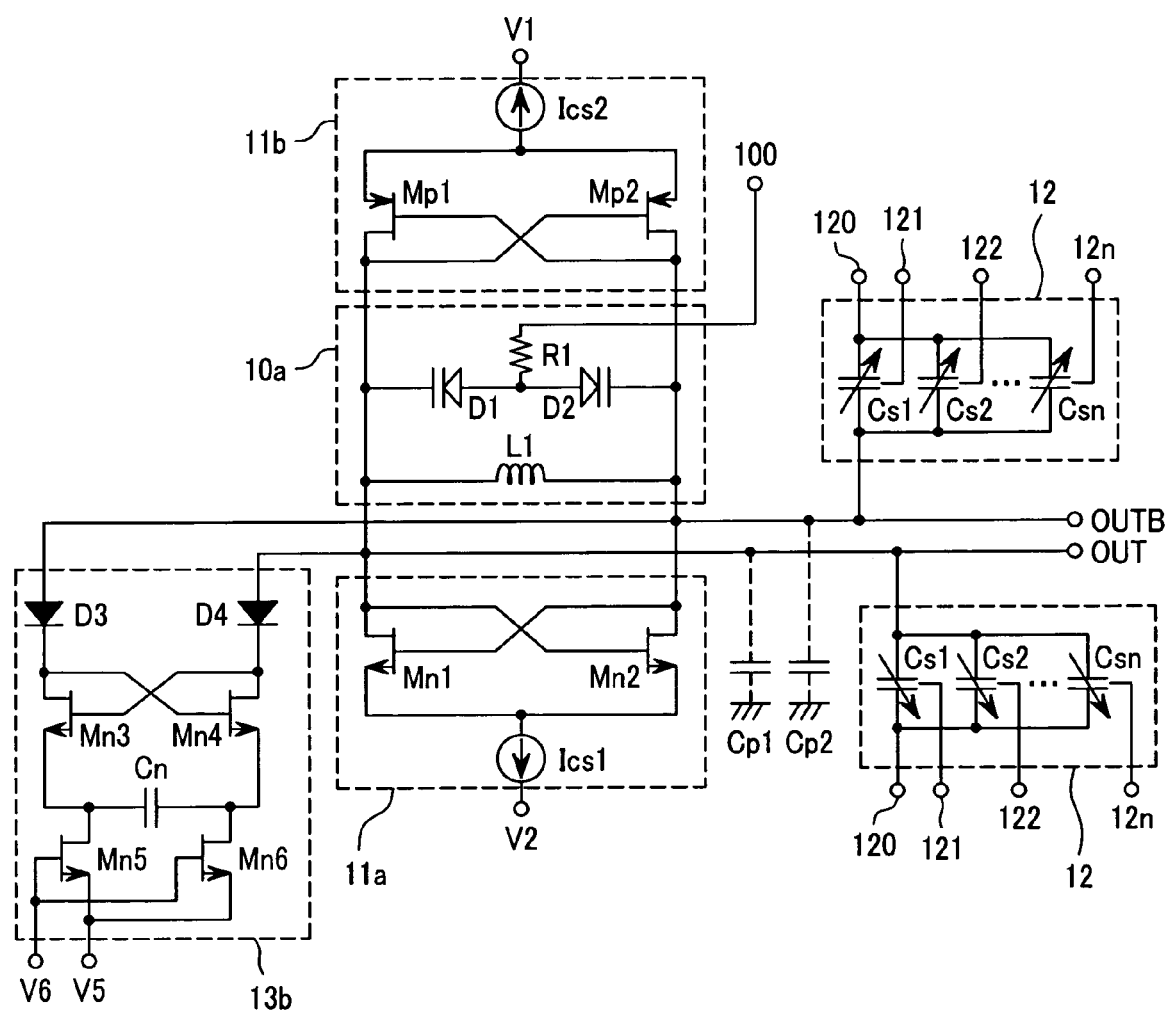
FIG. 7 is a circuit diagram for explaining a fourth embodiment of the present invention.

FIG. 7 shows a fourth embodiment according to the present invention. The third embodiment shown in FIG. 6 is realized by MOS transistors. The drain of an nMOS transistor Mn3 is coupled with the resonation node OUTB through the diode D3 (first diode), and the drain of the nMOS transistor Mn4 is coupled with a resonation node OUT through the diode D4 (second diode). Other structures are identical with those in FIG. 5.

This embodiment has the advantages that the sharpness Q of the resonation viewed from the resonation nodes OUT and OUTB is improved by the diodes D3 and D4, and that the operable supply voltage is set to about 1.8 V that reduces the supply voltage by about 40% in contrast with the bipolar voltage controlled oscillator shown in FIG. 6 which operates at about 3 V.

Figure 8:
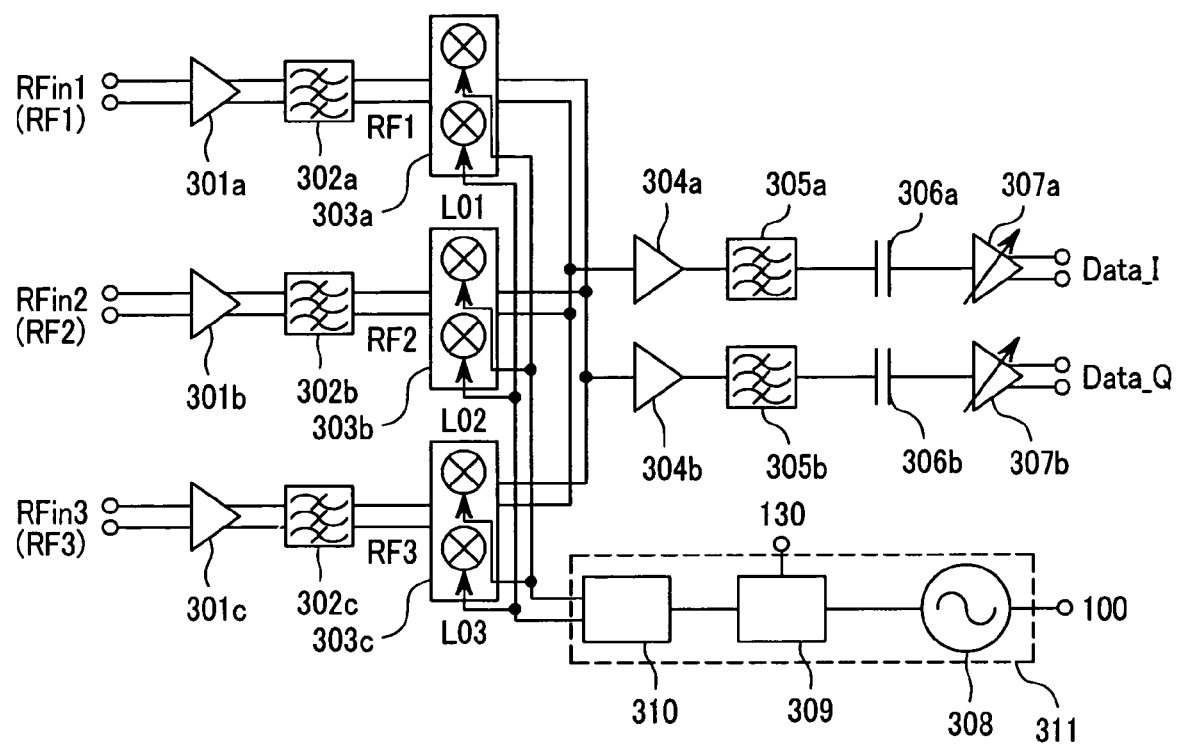
FIG. 8 is a structural diagram for explaining a fifth embodiment of the present invention.

FIG. 8 shows a fifth embodiment according to the present invention. FIG. 8 is a wireless transceiver including a voltage controlled oscillator 308 of the present invention, which is selected from the voltage controlled oscillators of the first to fourth embodiments. The wireless transceiver according to this embodiment is structured by a three input wireless receiver of the direct conversion system which inputs three received signals RFin1, RFin2, and RFin3 of wireless frequencies, and directly converts those input signals into low frequency signals. The low frequency signals consist of a low frequency signal in-phase component (I phase signal) and a low frequency signal quadrature component (Q phase signal).

With respect to the received signal RFin1 of the frequency RF1, there are provided a low noise amplifier 301a that amplifies the received signal RFin1, a band pass filter 302a that removes unnecessary waves from an output signal of the low noise amplifier 301a, and a direct conversion mixer 303a that converts an output signal of the band pass filter 302a into the low frequency signals. Likewise, a low noise amplifier 301b, a band pass filter 302b, and a direct conversion mixer 303b are provided with respect to the received signal RFin2 of the frequency RF2, and a low noise amplifier 301c, a band pass filter 302c, and a direct conversion mixer 303c are provided with respect to the received signal RFin3 of the frequency RF3. Thus, three receiving paths consisting of unique circuits are disposed with respect to the received signals RFin1, RFin2, and RFin3. The frequencies RF1, RF2, and RF3 are different from each other.

Three kinds of local-oscillator signals L01, L02, and L03 which are different in the frequency from each other and generated in a local-oscillator circuit 311 are supplied to the direct conversion mixers 303a, 303b, and 303c. Each of the local-oscillator signals L01, L02, and L03 consists of two signals that are different in the phase from each other by 90 degrees, that is, quadrature to each other. The low frequency signals are outputted from the mixers 303a, 303b, and 303c as common outputs.

In this example, the above three receiving paths do not operate at the same time, but only one receiving path operates according to the communication status or the user's selection. Every selected path outputs the low frequency signal in-phase component and the low frequency signal quadrature component as the common outputs. After the common outputs of the mixers 303a to 303c are amplified by amplifiers 304a and 304b, unnecessary waves are removed from the common outputs by the low pass filters 305a and 305b, and the common outputs are again amplified by variable gain amplifiers 307a and 307b after passing through interstage capacitors 306a and 306b. Signal Data_I and Data_Q of both phases of I/Q are outputted from the variable gain amplifiers 307a and 307b. The outputting path is structured by the amplifiers 304a, 304b, the low pass filters 305a, 305b, the interstage capacitors 306a, 306b, and variable gain amplifiers 307a, 307b.

The local-oscillator circuit 311 is made up of the voltage controlled oscillator 308 of the present invention which is selected from the voltage controlled oscillator of the first to fourth embodiments, the variable frequency divider 309 that is switched over between two characteristics consisting of two frequency division and no frequency division, and the signal frequency divider 310 that provides the two frequency dividing function and the function of generating a signal that has the 90 degree phase difference. The local-oscillator signals LO1, LO2, and LO3 are outputted from the signal divider 310.

Since the voltage controlled oscillator 308 according to the present invention is so mounted as to output the wide oscillation frequency by the single oscillator, it is possible to commonly use the local-oscillator circuit 311 in the three paths. Accordingly, the chip area can be reduced, and the costs can be reduced.

Figure 9:
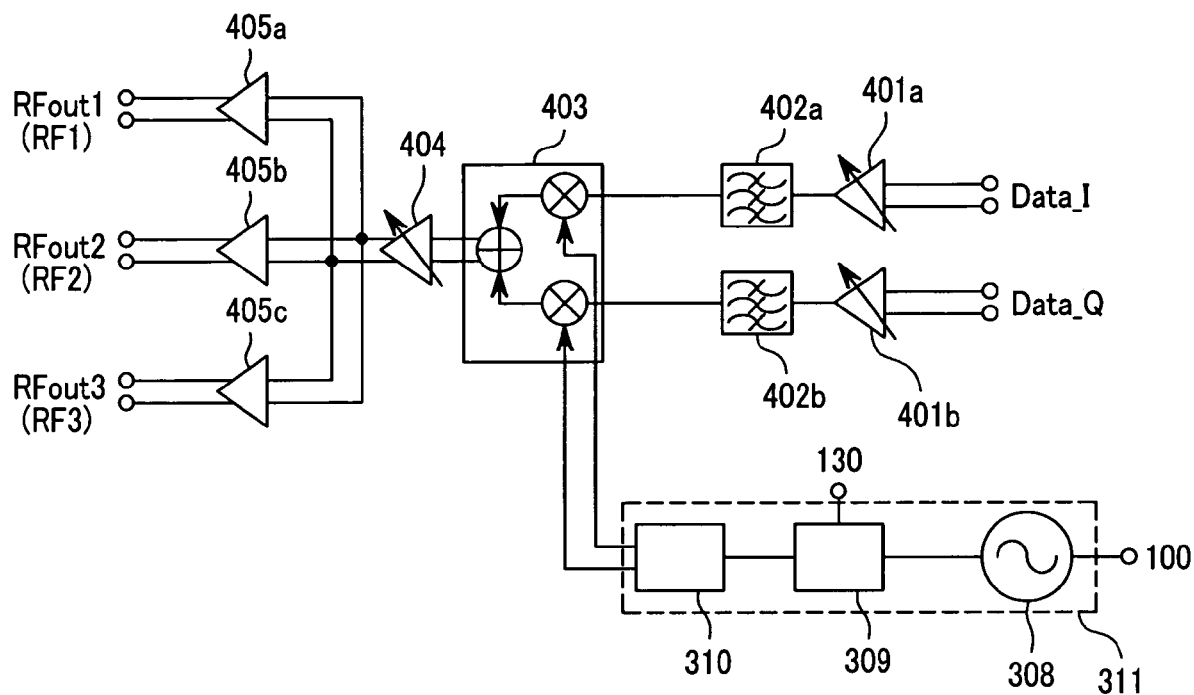
FIG. 9 is a structural diagram for explaining a sixth embodiment of the present invention.
Figure 10:
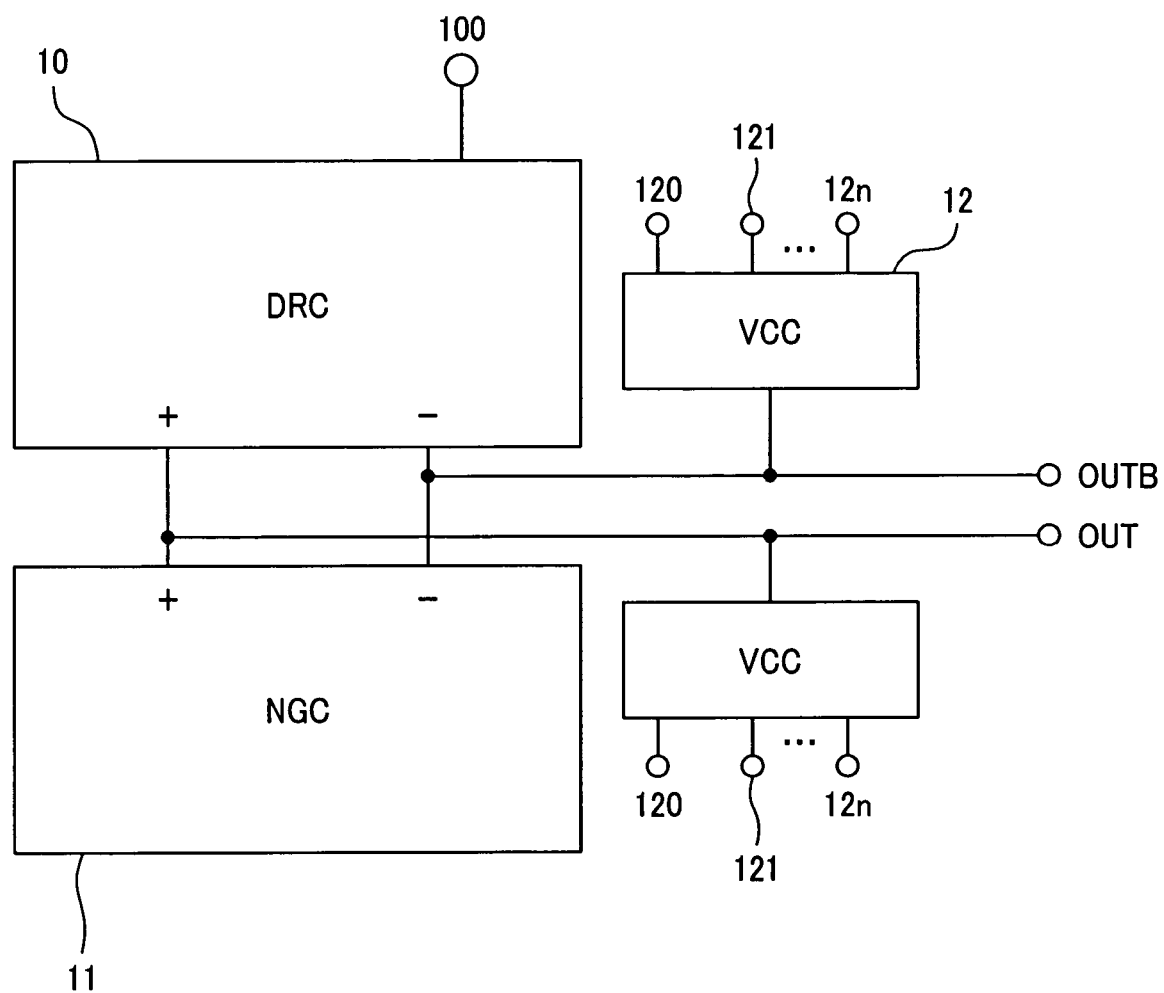
FIG. 10 is a structural diagram for explaining a general voltage controlled oscillator.
Figure 11:
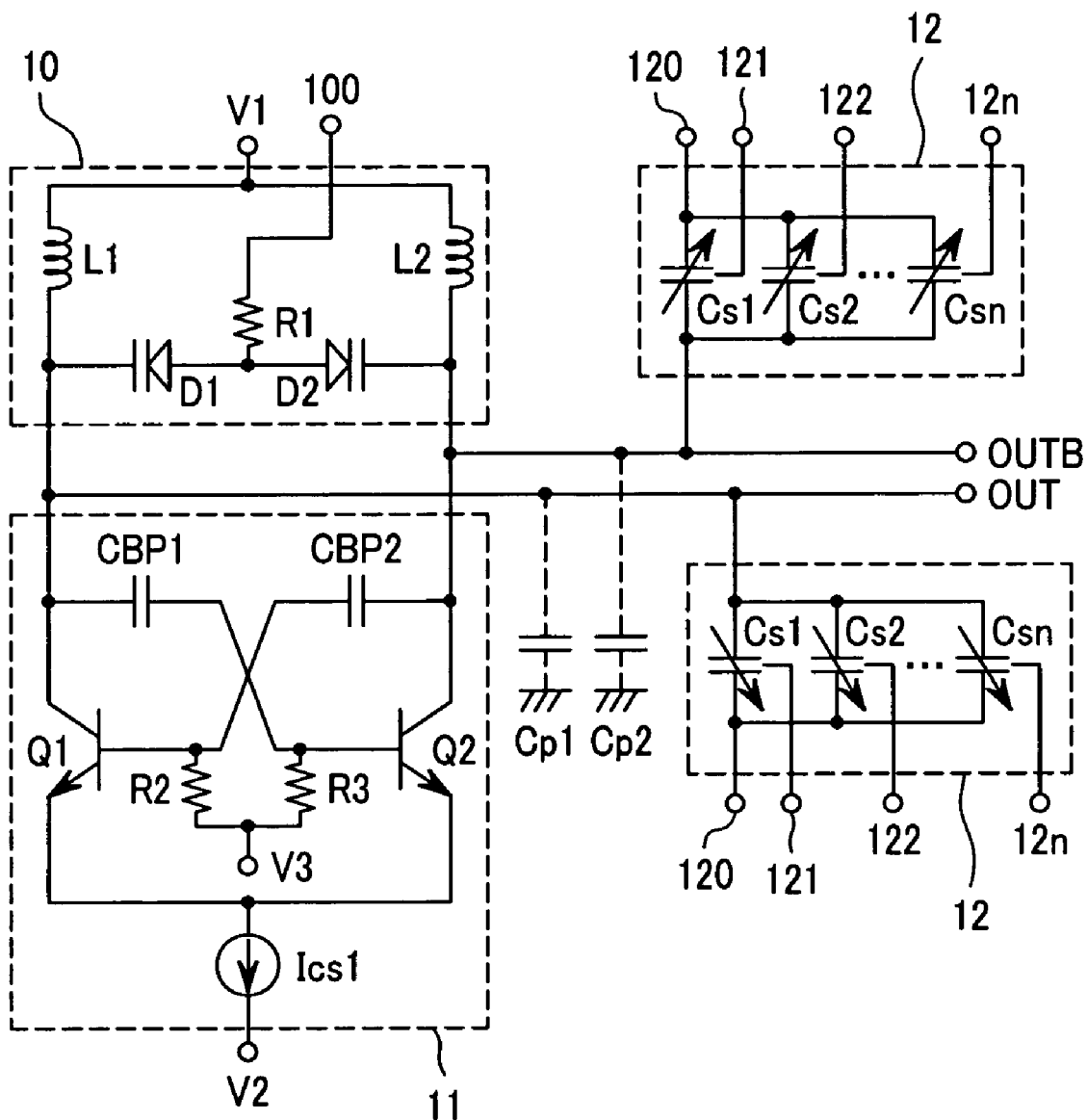
FIG. 11 is a circuit diagram for explaining a general voltage controlled oscillator.
Figure 12A:
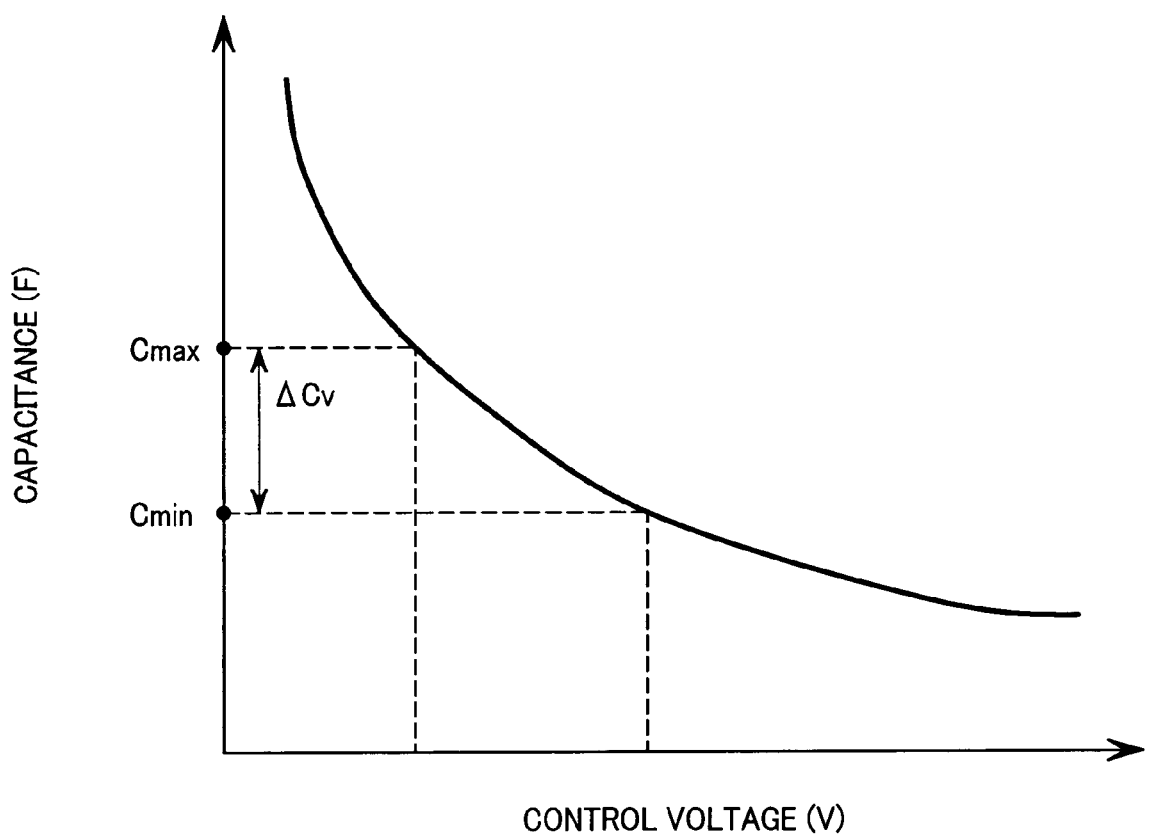
FIG. 12A is a diagram showing an example of the control characteristic of a variable capacitor control.
Figure 12B:
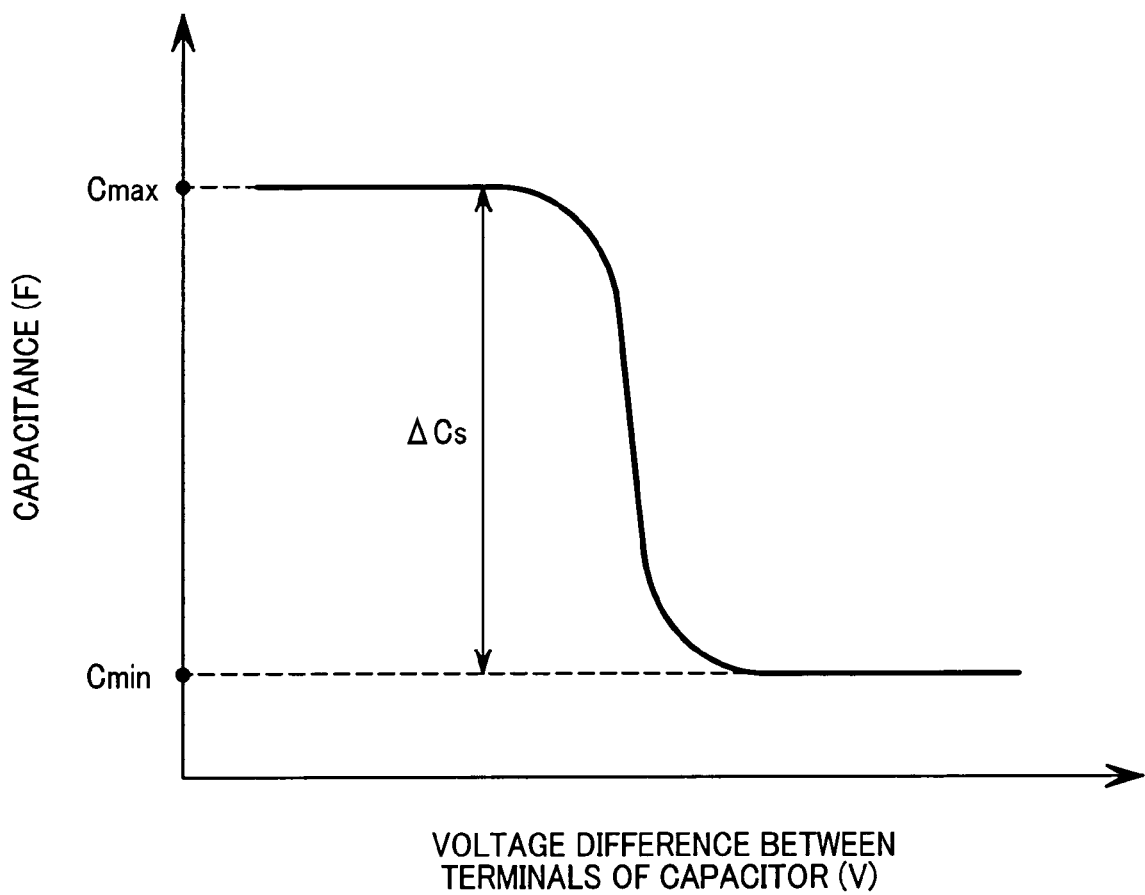
FIG. 12B is a diagram showing another example of the control characteristic of a variable capacitor control.

FIG. 9 shows a sixth embodiment according to the present invention. FIG. 9 shows another wireless transceiver that includes the voltage controlled oscillator 308 according to the present invention which is selected from the voltage controlled oscillator of the first to fourth embodiments. The wireless transceiver according to this embodiment is structured by a three-input wireless transmitter of the direct conversion system which directly converts an inputted modulation signal MOD_I (modulation signal in-phase component) and a modulation signal MOD_Q (modulation signal quadrature component) into transmission signals RFout1, RFout2, and RFout3 of three radio frequencies. The frequencies of the transmission signals RFout1, RFout2, and RFout3 are RF1, RF2, and RF3 which are different from each other.

The modulation signals MOD-I and MOD-Q are inputted to variable gain amplifiers 401a and 401b in the differential form, respectively. Unnecessary waves are removed from the output signals of the variable gain amplifiers 401a and 401b through the low pass filters 402a and 402b. A modulation signal path to a modulator includes the variable gain amplifiers 401a, 401b, and the low pass filters 402a, 402b.

The output signals of the low pass filters 402a and 402b are inputted to the direct conversion modulator 403, and converted into one transmission signal that is selected from the transmission signals RFout1, RFout2, and RFout3. The transmission signal that has been outputted from the modulator 403 is amplified by a variable gain amplifier 404, and then amplified by any one of output amplifiers 405a, 405b, and 405c which are divided into three paths. The transmission signals RFout1, RFout2, and RFout3 are selected by the communication status or the user's selection. In this way, the above three paths do not operate at the same time, and an approximate wireless received signal is outputted from the output amplifier of the selected one path.

Similarly, in the above transmitter, three kinds of local-oscillator signals LO1, LO2, and LO3 different in the frequency from each other which are generated by the local-oscillator circuit 311 are supplied to the direct conversion modulator 403. As described above, each of the local-oscillator signals LO1, LO2, and LO3 consists of two signals that are different in the phase from each other by 90 degrees, that is, quadrature to each other. Similarly, in this embodiment, a wide oscillation frequency can be outputted by a single oscillator by mounting the voltage controlled oscillator 308 of the present invention, thereby making it possible to use the local-oscillator circuit 311 commonly to the three paths. As a result, there is obtained the advantages that the chip area can be reduced, and the low costs can be reduced.

In the respective embodiments, needless to say, the effects of the present invention is obtained not only when the bipolar transistor or the MOS transistor is used, but also when the bipolar transistor or the MOS transistor is replaced with a field effect transistor, a hetero junction bipolar transistor, a high electron mobility transistor, or a metal semiconductor junction field effect transistor. Also, npn type circuit structure with respect to the bipolar transistor, the CMOS circuit structure using the p-type and the n-type in the negative conductance with respect to MOS transistor are shown. However, needless to say, the same effects are obtained by a pnp type circuit structure and a MOS circuit structure in which the p type and the n type are replaced with the n type and the p type respectively taking the polarity of the supply voltage into consideration.

It is further understood by those skilled in the art that the foregoing description is a preferred embodiment of the disclosed device and that various changes and modifications may be made in the invention without departing from the spirit and scope thereof.

What is claimed is:

1. A voltage controlled oscillator, comprising:
 a differential negative conductance generator circuit having first and second terminals for differential output;
 a differential resonant circuit having a variable capacitance which is controlled by voltage control and an inductance connected in parallel to each other, the differential resonant circuit being connected between the first terminal and the second terminal; and
 a differential negative impedance circuit connected between the first terminal and the second terminal,
 wherein a capacitance of a capacitor with a constant capacitance that occurs between the first terminal and the second terminal is reduced by a negative impedance of the differential negative impedance circuit,
 wherein the differential negative conductance generator circuit includes:
 a first transistor whose output terminal is connected to the first terminal; and
 a second transistor whose output terminal is connected to the second terminal,
 wherein an input terminal of the first transistor is connected to the second terminal through a first capacitor, an input terminal of the second transistor is connected to the first terminal through a second capacitor, ground terminals of the first transistor and the second transistor are connected to each other, and a first current source is connected to a connection node of the ground terminals, wherein the differential negative impedance circuit includes:

a third transistor whose output terminal is connected to the second terminal;

a fourth transistor whose output terminal is connected to the first terminal;

a third capacitor which is connected between a ground terminal of the third transistor and a ground terminal of the fourth transistor, and wherein an input terminal of the third transistor is connected to an input terminal of the second transistor, an input terminal of the fourth transistor is connected to an input terminal of the first transistor, a second current source is connected to the ground terminal of the third transistor, and a third current source is connected to the ground terminal of the fourth transistor, wherein the first current source includes a fifth transistor whose output terminal is connected to the connection node, wherein an input terminal of the fifth transistor is connected to a first voltage source, and a ground terminal of the fifth transistor is coupled to a second voltage source, wherein the second current source includes a sixth transistor whose output terminal is connected to the ground terminal of the third transistor, wherein an input terminal of the sixth transistor is connected to a third voltage source, and a ground terminal of the sixth transistor is coupled to a fourth voltage source, wherein the third current source includes a seventh transistor whose output terminal is connected to the ground terminal of the fourth transistor, and wherein an input terminal of the seventh transistor is connected to the third voltage source, and a ground terminal of the seventh transistor is coupled with the fourth voltage source.

2. The voltage controlled oscillator according to claim 1, wherein the first to seventh transistors comprise bipolar transistors each having a collector as the output terminal, a base as the input terminal, and an emitter as the ground terminal.

3. A voltage controlled oscillator, comprising:

a differential negative conductance generator circuit having first and second terminals for differential output;

a differential resonant circuit having a variable capacitance which is controlled by voltage control and an inductance connected in parallel to each other, the differential resonant circuit being connected between the first terminal and the second terminal; and a differential negative impedance circuit connected between the first terminal and the second terminal, wherein a capacitance of a capacitor with a constant capacitance that occurs between the first terminal and the second terminal is reduced by a negative impedance of the differential negative impedance circuit, wherein the differential negative conductance generator circuit includes:

a first transistor whose output terminal is connected to the first terminal; and a second transistor whose output terminal is connected to the second terminal, wherein an input terminal of the first transistor is connected to the second terminal through a first capacitor, an input terminal of the second transistor is connected to the first terminal through a second capacitor, ground terminals of the first transistor and the second transistor are connected to each other, and a first current source is connected to a connection node of the ground terminals, wherein the differential negative impedance circuit includes:

a third transistor whose output terminal is coupled to the second terminal;

a fourth transistor whose output terminal is coupled to the first terminal; and a third capacitor which is connected between a ground terminal of the third transistor and a ground terminal of the fourth transistor, and wherein an input terminal of the third transistor is connected to the output terminal of the fourth transistor, an input terminal of the fourth transistor is connected to the output terminal of the third transistor, a second current source is connected to the ground terminal of the third transistor, and a third current source is connected to the ground terminal of the fourth transistor, wherein the first current source includes a fifth transistor whose output terminal is connected to the connection node, wherein an input terminal of the fifth transistor is connected to a first voltage source, and a ground terminal of the fifth transistor is coupled to a second voltage source, wherein the second current source includes a sixth transistor whose output terminal is connected to the ground terminal of the third transistor, wherein an input terminal of the sixth transistor is connected to a third voltage source, and a ground terminal of the sixth transistor is coupled to a fourth voltage source, wherein the third current source includes a seventh transistor whose output terminal is connected to the ground terminal of the fourth transistor, and wherein an input terminal of the seventh transistor is connected to the third voltage source, and a ground terminal of the seventh transistor is coupled to the fourth voltage source.

4. The voltage controlled oscillator according to claim 3, wherein the first to seventh transistors comprise bipolar transistors each having a collector as the output terminal, a base as the input terminal, and an emitter as the ground terminal.

5. The voltage controlled oscillator according to claim 3, wherein the second terminal is coupled to the output terminal of the third transistor through a first diode, and the first terminal is coupled with the output terminal of the fourth transistor through a second diode.

6. The voltage controlled oscillator according to claim 5, wherein the first to seventh transistors comprise bipolar transistors each having a collector as the output terminal, a base as the input terminal, and an emitter as the ground terminal.

7. A voltage controlled oscillator, comprising:

a differential negative conductance generator circuit having first and second terminals for differential output;

a differential resonant circuit having a variable capacitance which is controlled by voltage control and an inductance connected in parallel to each other, the differential resonant circuit being connected between the first terminal and the second terminal; and a differential negative impedance circuit connected between the first terminal and the second terminal, wherein a capacitance of a capacitor with a constant capacitance that occurs between the first terminal and the second terminal is reduced by a negative impedance of the differential negative impedance circuit, wherein the differential negative conductance generator circuit comprises a first differential negative conductance generator circuit and a second differential negative conductance generator circuit, wherein the first differential negative conductance generator circuit includes:

a first nMOS transistor whose drain is connected to the first terminal and whose gate is connected to the second terminal; and a second nMOS transistor whose drain is connected to the second terminal and whose gate is connected to the first terminal, wherein sources of the first nMOS transistor and the second nMOS transistor are connected to each other, and a connection node of the sources is connected to a first current source, wherein the second differential negative conductance generator circuit includes:

a first pMOS transistor whose drain is connected to the first terminal and whose gate is connected to the second terminal; and a second pMOS transistor whose drain connected to the second terminal and whose gate is connected to the first terminal, wherein sources of the first pMOS transistor and the second pMOS transistor are connected to each other, and a connection node of the sources is connected to a second current source, wherein the differential negative impedance circuit comprises:

a third nMOS transistor whose drain is coupled to the first terminal;

a fourth nMOS transistor whose drain is coupled to the second terminal; and a capacitor connected between a source of the third nMOS transistor and a source of the fourth nMOS transistor, and wherein a gate of the third nMOS transistor is connected to the drain of the fourth nMOS transistor, a gate of the fourth nMOS transistor is connected to the drain of the third nMOS transistor, the source of the third nMOS transistor is connected to a third current source, and the source of the fourth nMOS transistor is connected to a fourth current source.

8. The voltage controlled oscillator according to claim 7, wherein the third current source includes a fifth nMOS transistor whose drain is connected to the source of the third nMOS transistor, wherein a gate of the fifth nMOS transistor is connected to a first voltage source, and a source of the fifth nMOS transistor is connected to a second voltage source, wherein the fourth current source includes a sixth nMOS transistor whose drain is connected to the source of the fourth nMOS transistor, and wherein a gate of the sixth nMOS transistor is connected to the first voltage source, and a source of the sixth nMOS transistor is connected to the second voltage source.

9. The voltage controlled oscillator according to claim 8, wherein the first terminal is coupled to the drain of the third nMOS transistor through a first diode, and the second terminal is coupled to the drain of the fourth nMOS transistor through a second diode.

* * * * *